(12) United States Patent
Ding et al.

(10) Patent No.: US 9,330,888 B2
(45) Date of Patent: May 3, 2016

(54) DRY ETCHING METHOD

(71) Applicants: BOE TECHNOLOGY GROUP CO., LTD., Beijing (CN); BEIJING BOE DISPLAY TECHNOLOGY CO., LTD., Beijing (CN)

(72) Inventors: Xiangqian Ding, Beijing (CN); Yao Liu, Beijing (CN); Xi Chen, Beijing (CN); Liangliang Li, Beijing (CN); Jinchao Bai, Beijing (CN); Xiaowei Liu, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/447,915

(22) Filed: Jul. 31, 2014

(65) Prior Publication Data
US 2015/0311039 A1     Oct. 29, 2015

(30) Foreign Application Priority Data
Apr. 25, 2014  (CN) .......................... 2014 1 0171759

(51) Int. Cl.
*H01J 37/32*    (2006.01)
(52) U.S. Cl.
CPC ....... *H01J 37/32082* (2013.01); *H01J 37/3244* (2013.01); *H01J 2237/334* (2013.01)
(58) Field of Classification Search
CPC ................... H01L 21/02063; H01L 21/31116; H01L 21/76814; H01L 37/32082; H01L 37/3244
See application file for complete search history.

(56) References Cited

U.S. PATENT DOCUMENTS

| | | | |
|---|---|---|---|
| 6,177,347 B1 * | 1/2001 | Liu ................... | H01L 21/76808 257/E21.577 |
| 2003/0045115 A1 * | 3/2003 | Fang ............................. | 438/710 |
| 2005/0054202 A1 * | 3/2005 | Pan et al. ...................... | 438/694 |
| 2005/0059234 A1 * | 3/2005 | Bera et al. ..................... | 438/633 |

OTHER PUBLICATIONS

Hiroyuki Kobayashi (Behavior of Dust Particles in Plasma Etching Apparatus. Jap. Journal of Applied Physics 50 (2011)(7 pages)).*

* cited by examiner

*Primary Examiner* — Duy Deo
*Assistant Examiner* — Mahmoud Dahimene
(74) *Attorney, Agent, or Firm* — Nath, Goldberg & Meyer; Joshua B. Goldberg; Christopher Thomas

(57) ABSTRACT

The present invention discloses a dry etching method. The dry etching method comprises: etching a first medium layer; introducing a second reaction gas in a reaction chamber, and exciting the second reaction gas into plasmas with a second radiofrequency power, so that the plasmas formed from the second reaction gas are combined with particulate pollutants in the reaction chamber, and in this case the reaction chamber is vacuumized to perform conversion processing; and etching a second medium layer. The technical solution of the present invention is capable of effectively preventing particulate pollutants from falling onto the glass substrate in the procedure of executing conversion processing, meanwhile, the effect of chamber purifying through vacuumizing is improved, and the amount of the particulate pollutants in the reaction chamber is effectively reduced.

8 Claims, 4 Drawing Sheets

DRY ETCHING METHOD

FIELD OF THE INVENTION

The present invention relates to the field of display technology, and particularly relates to a dry etching method.

BACKGROUND OF THE INVENTION

Dry etching is a technology for carrying out thin film etching by using of plasmas. Gases have two characteristics in the case of existing in the form of plasmas: on one hand, the chemical activities of the gases in the form of plasmas are much higher than those of the gases in a normal state, therefore selecting a proper gas according to different etched materials can make it reacting with the materials more quickly, so as to realize the purpose of etching removal; on the other hand, the plasmas can also be guided and accelerated by an electric field so as to accumulate a certain energy, and atoms of the etching object material are struck out while the plasmas strike the surface of the etching object, thus achieving the purpose of realizing etching by physical energy transfer.

In a process of producing a display panel, a plurality of medium layers on a glass substrate need to be etched by dry etching, and a step of "conversion processing" needs to be performed once after each medium layer is etched. The "conversion processing" is used for creating a clean environment for etching for another medium layer. The conventional "conversion processing" generally comprise steps of turning off a radiofrequency module in a dry etching equipment and stopping introducing a reaction gas used for etching a previous medium layer into a reaction chamber, and meanwhile, performing vacuumizing processing on the reaction chamber by a vacuum pump.

After the "conversion processing" is finished, a reaction gas required for etching a next medium layer is introduced into the reaction chamber, and the radiofrequency module is turned on again to excite the reaction gas to form into plasmas, so as to etch the next medium layer.

However, when the "conversion processing" is performed, introducing the gas into the reaction chamber is stopped, and the radiofrequency module is turned off, thus the plasmas in the reaction chamber are suddenly extinguished. At this moment, particulate pollutants suspending in the plasmas may fall onto the glass substrate, and thus cause pollution to subsequent manufacture procedures, which results in defectiveness of the display panel.

SUMMARY OF THE INVENTION

The present invention provides a dry etching method capable of effectively preventing particulate pollutants from falling onto the glass substrate in a process of performing "conversion processing", meanwhile, the effect of purifying through vacuumizing is improved, and the amount of the particulate pollutants in the reaction chamber is effectively reduced.

In order to realize the object above, the present invention provides a dry etching method, comprising steps of: etching a first medium layer in a reaction chamber; performing conversion processing by vacuumizing the reaction chamber; and etching a second medium layer in the reaction chamber, wherein the step of performing conversion processing further comprises: introducing a second reaction gas into the reaction chamber, and exciting the second reaction gas into plasmas with a second radiofrequency power, so that the plasmas formed from the second reaction gas are combined with particulate pollutants in the reaction chamber.

Optionally, the step of etching the first medium layer comprises: introducing a first reaction gas into the reaction chamber, and exciting the first reaction gas into plasmas with a first radiofrequency power, so that the plasmas formed from the first reaction gas are used for etching the first medium layer, wherein the second radiofrequency power is less than the first radiofrequency power.

Optionally, the step of etching the second medium layer comprises: introducing a third reaction gas into the reaction chamber, and exciting the third reaction gas into plasmas with a third radiofrequency power, so that the plasmas formed from the third reaction gas are used for etching the second medium layer, wherein the third radiofrequency power is greater than the second radiofrequency power.

Optionally, the second reaction gas is the same as the third reaction gas.

Optionally, the second radiofrequency power ranges from 500 to 2000 W.

Optionally, the second reaction gas is an inert gas.

Optionally, the inert gas is argon or helium.

Optionally, in the process of exciting the second reaction gas into plasmas with the second radiofrequency power, a gas pressure in the reaction chamber is less than 20 mt.

In the dry etching method according to the present invention, after a first medium layer is etched, plasmas are formed by introducing a second reaction gas into a reaction chamber, and exciting the second reaction gas with a second radiofrequency power, so that the plasmas formed from the second reaction gas are combined with particulate pollutants in the reaction chamber so as to form dust plasmas, and in this case the reaction chamber is vacuumized to perform conversion processing, therefore, the technical solution of the present invention is capable of effectively preventing particulate pollutants from falling onto the glass substrate in the procedure of performing conversion processing, meanwhile, the effect of purifying through vacuumizing is improved, and the amount of the particulate pollutants in the reaction chamber is effectively reduced.

DETAILED DESCRIPTION OF THE EMBODIMENTS

To make a person skilled in the art better understand the technical solution of the present invention, the dry etching method provided by the present invention is described in details below in combination with the accompanying drawings.

First Embodiment

Figure 1:
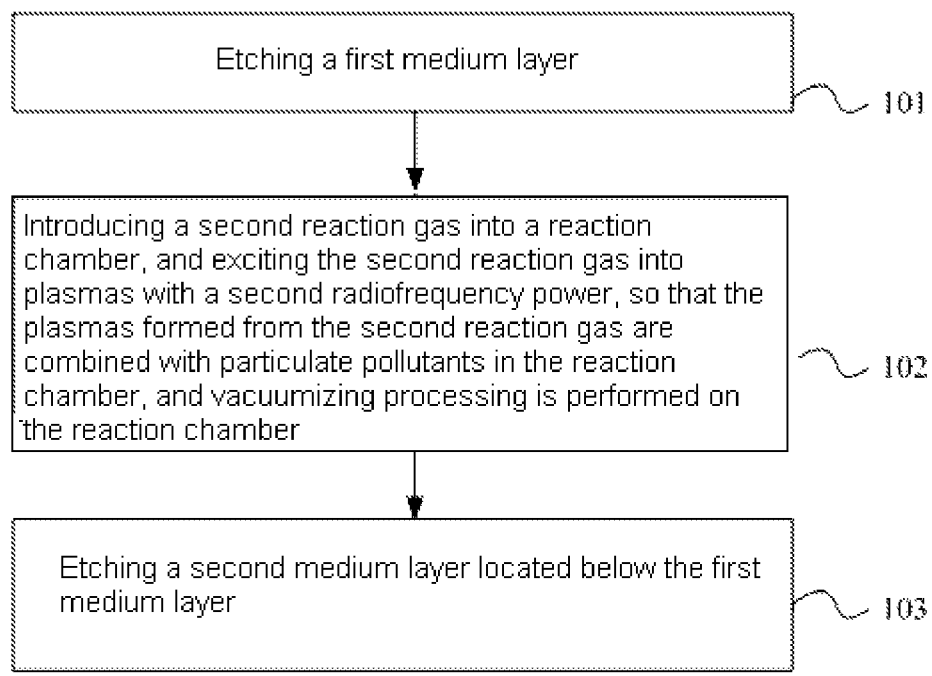
FIG. 1 is a flow diagram of the dry etching method provided by a first embodiment of the present invention.

FIG. 1 is a flow diagram of the dry etching method provided by the first embodiment of the present invention. as shown in FIG. 1, the dry etching method comprising the following steps 101, 102 and 103.

Step 101: etching a first medium layer in a reaction chamber.

Step 102: introducing a second reaction gas into the reaction chamber, and exciting the second reaction gas into plasmas with a second radiofrequency power, so that the plasmas formed from the second reaction gas are combined with particulate pollutants in the reaction chamber, and then conversion processing is performed by vacuumizing the reaction chamber.

The difference between the present invention and the background art lies in that: when the conversion processing is performed, the second reaction gas is introduced into the reaction chamber, and the radiofrequency module keeps working, at this moment, the second reaction gas is excited into plasmas with the second radiofrequency power provided by the radiofrequency module, and the plasmas formed from the second reaction gas are combined with the particulate pollutants in the reaction chamber in order to form dust plasmas, thus ensuring that the particulate pollutants in the reaction chamber are in a suspended state. In such case, the effect of purifying the chamber can be effectively realized through p vacuumizing processing for the reaction chamber.

By executing step 102, the particulate pollutants in the reaction chamber keep in the suspended state after the first medium layer is etched in step 101, thus preventing the particulate pollutants from falling onto the glass substrate, which may cause pollution to the subsequent manufacture procedures. At this moment, the vacuumizing processing is performed for the reaction chamber by the vacuum pump, and the suspended particulate pollutants are extracted, thus achieving the purpose of effectively cleaning the reaction chamber.

It should be noted that, in step 102 of the embodiment, firstly exciting the second reaction gas into plasma, and a while after the vacuumizing processing is carried out. Alternatively, the exciting into plasma and vacuumizing may be executed simultaneously.

Step 103: etching a second medium layer in the reaction chamber.

After step 102 is executed, the interior of the reaction chamber and the surface of the second medium layer are in a clean state, thus ensuring procedure of the etching process for the second medium layer to be effectively.

It should be noted that, the dry etching method provided by the present invention is not limited to etching two medium layers. Three or more medium layers may be etched by repeatedly executing step 102 and step 103.

According to the dry etching method provided by the first embodiment of the present invention, after the first medium layer is etched, the plasmas are formed by introducing the second reaction gas into the reaction chamber and exciting the second reaction gas with the second radiofrequency power, so that the plasmas formed from the second reaction gas are combined with the particulate pollutants in the reaction chamber to form the dust plasmas, and then the vacuumizing processing is performed for the reaction chamber, so as to complete one conversion processing. The technical solution of the present invention is capable of effectively preventing particulate pollutants from falling onto the glass substrate in the procedure of performing the conversion processing, meanwhile, the effect of chamber purifying through vacuumizing is improved, and the amount of the particulate pollutants in the reaction chamber is effectively reduced.

Second Embodiment

Figure 2:
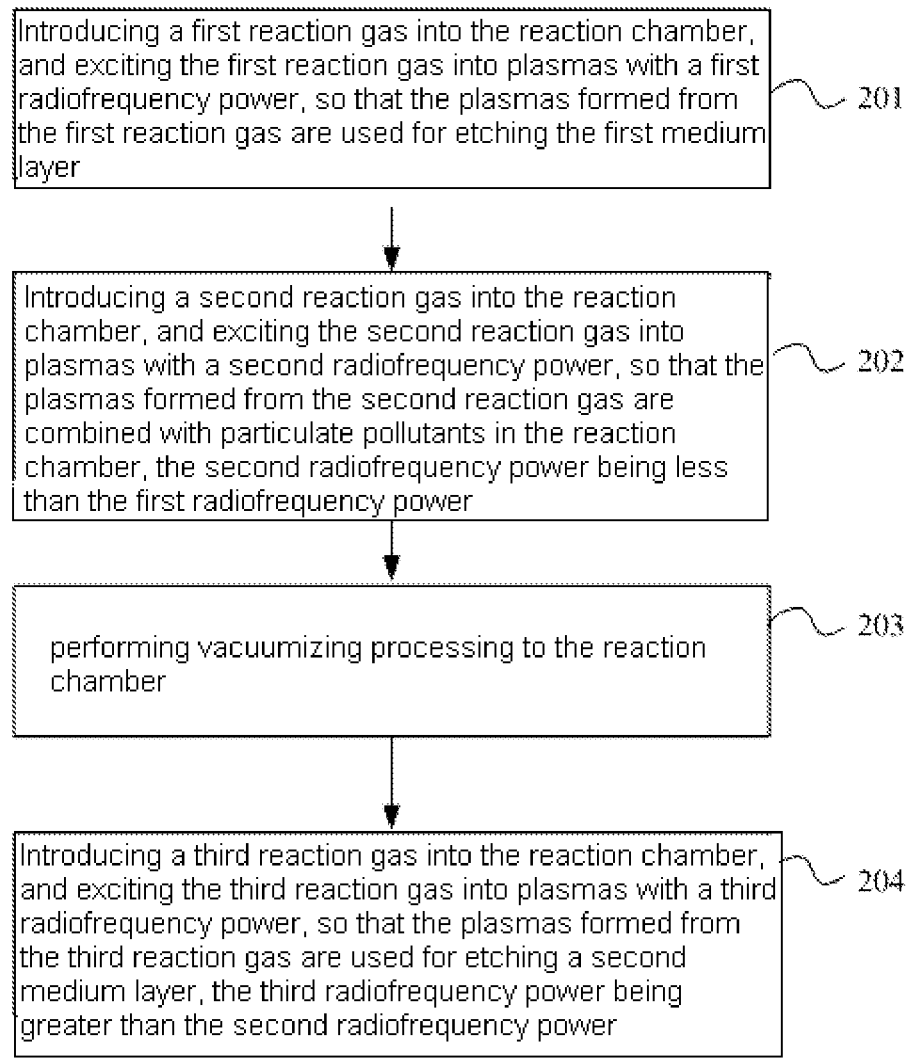
FIG. 2 is a flow diagram of the dry etching method provided by a second embodiment of the present invention.

FIG. 2 is a flow diagram of the dry etching method provided by the second embodiment of the present invention. As shown in FIG. 2, the dry etching method comprising the following steps 201, 202, 203 and 204.

Step 201: introducing a first reaction gas into the reaction chamber, and exciting the first reaction gas into plasmas with a first radiofrequency power, so that the plasmas formed from the first reaction gas are used for etching the first medium layer.

Step 201 is the same as the process of etching a medium layer by plasmas in the prior art, and the specific contents and optional modes are not described redundantly herein.

Step 202: introducing a second reaction gas into the reaction chamber, and exciting the second reaction gas into plasmas with a second radiofrequency power, so that the plasmas formed from the second reaction gas are combined with particulate pollutants in the reaction chamber. The second radiofrequency power is less than the first radiofrequency power.

In the process of executing step 202, the second radiofrequency power is less than the first radiofrequency power, thus the amount of the plasmas formed from the second reaction gas in the reaction chamber is small. Therefore, the etching effect of the plasmas formed from the second reaction gas on the second medium layer is low, thus reducing the influence of the step 202 on the subsequent etching process for the second medium layer. Optionally, the second radiofrequency power ranges from 500 to 2000 W.

In order to further reduce the etching effect of the plasmas formed from the second reaction gas on the second medium layer, in the embodiment, the amount of the plasmas in the reaction chamber can also be reduced by reducing the amount of the second reaction gas introduced into the reaction chamber, such that the etching effect of the plasmas in the reaction chamber on the second medium layer is reduced. Optionally, in the process of executing step 202, the gas pressure in the reaction chamber is less than 20 mt.

Step 203: performing vacuumizing processing to the reaction chamber.

It should be noted that, in the embodiment, firstly step 202 is executed, and a while after step 203 is executed. Alternatively, step 202 and step 203 may be executed simultaneously.

Step 204: introducing a third reaction gas into the reaction chamber, and exciting the third reaction gas into plasmas with a third radiofrequency power, so that the plasmas formed from the third reaction gas are used for etching the second medium layer. The third radiofrequency power is greater than the second radiofrequency power.

The etching process of step 204 is the same as the process of etching a medium layer by plasmas in the prior art, and the specific contents and optional modes are not described redundantly herein. Preferably, the third radiofrequency power in step 204 is greater than the second radiofrequency power, and then an enough amount of plasmas of the third reaction gas can be formed, thus effectively etching the second medium layer.

In the embodiment, it should be noted that, after step 203 is executed, a minim amount of the second reaction gas may still exist in the reaction chamber, and in order to prevent the second reaction gas and the third reaction gas from reacting with each other and thus to influence the proceeding of step 204, the second reaction gas and the third reaction gas may be the same gas, or the second reaction gas is an inert gas such as helium or argon.

It should be noted that, the first reaction gas, the second reaction gas and the third reaction gas in the embodiment may be a single gas or a mixed gas respectively.

According to the dry etching method provided by the second embodiment of the present invention, after the first medium layer is etched, the plasmas are formed by introducing the second reaction gas into the reaction chamber, and exciting the second reaction gas with the second radiofrequency power, so that the plasmas formed from the second reaction gas are combined with particulate pollutants in the reaction chamber to form the dust plasmas, and in this case the reaction chamber is vacuumized to perform conversion processing. Therefore, the technical solution of the present invention is capable of effectively preventing particulate pollutants from falling onto the glass substrate in the procedure of executing conversion processing, meanwhile, the effect of chamber purifying through vacuumizing is improved, and the amount of the particulate pollutants in the reaction chamber is effectively reduced.

Third Embodiment

In the third embodiment of the present invention, the dry etching method provided by the present invention is described by taking a process of forming a passivation layer and a gate insulation layer in a thin film transistor (referred to as TFT) for example, in which the passivation layer is located above the gate insulation layer. Although the materials of both the gate insulation layer and the passivation layer are silicon nitride (with a chemical formula of $Si_3N_4$), the hardness of the passivation layer is higher than that of the gate insulation layer, therefore, two-step etching is required to be carried out. Reaction gases selected in the process of etching the silicon nitride material to form the patterns of the passivation layer and the gate insulation layer are the same, and are the mixed gas of oxygen and sulphur hexafluoride.

Figure 3:
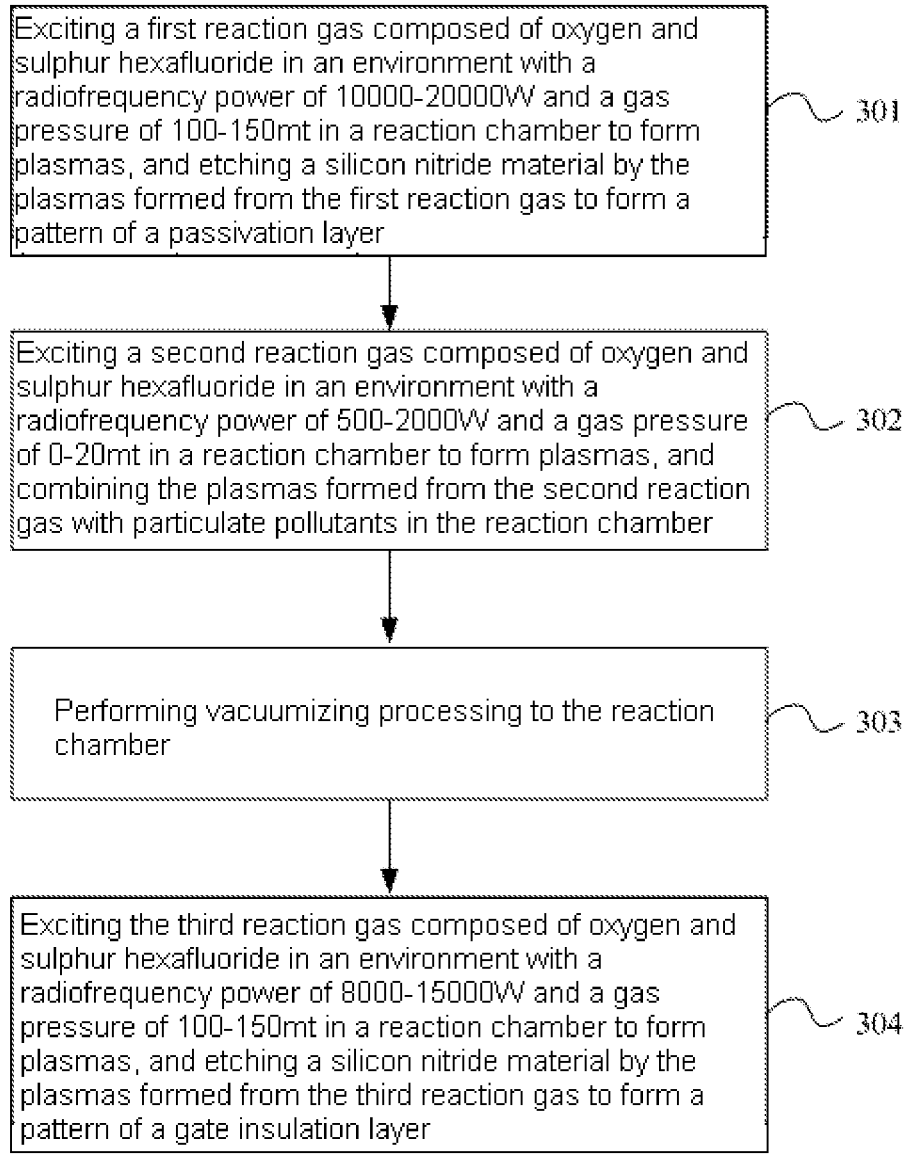
FIG. 3 is a flow diagram of the dry etching method provided by a third embodiment of the present invention.

FIG. 3 is a flow diagram of the dry etching method provided by the third embodiment of the present invention, as shown in FIG. 3, the dry etching method comprising the following steps 301, 302, 303 and 304.

Step 301: exciting a first reaction gas composed of oxygen and sulphur hexafluoride in an environment with a radiofrequency power of 10000-20000 W and a gas pressure of 100-150 mt in a reaction chamber to form plasmas, and etching a silicon nitride material by the plasmas formed from the first reaction gas to form the pattern of a passivation layer.

Step 302: exciting a second reaction gas composed of oxygen and sulphur hexafluoride in an environment with a radiofrequency power of 500-2000 W and a gas pressure of 0-20 mt in a reaction chamber to form plasmas, and combining the plasmas formed from the second reaction gas with particulate pollutants in the reaction chamber.

It should be noted that, in the embodiment, since the first reaction gas for etching the passivation layer and a third reaction gas for etching a gate insulation layer are the same, and are the mixed gas of oxygen and sulphur hexafluoride, the second reaction gas is selected the same as the first reaction gas and the third reaction gas in order to prevent the second reaction gas from reacting with the first reaction gas or the third reaction gas. Meanwhile, the second reaction gas is the same as the first reaction gas and the third reaction gas, so that the need of arranging additional gas inlet equipment and gas storage equipment is further avoided, thus reducing the cost of the equipment.

Meanwhile, the radiofrequency power in step 302 is also less than the radiofrequency powers in step 301 and the subsequent step 304.

Step 303: performing vacuumizing processing to the reaction chamber.

In the embodiment, step 302 may be executed at first, and then step 303 is executed a while after step 302. Alternatively, step 302 and step 303 may be executed simultaneously.

Step 304: exciting the third reaction gas composed of oxygen and sulphur hexafluoride in an environment with a radiofrequency power of 8000-15000 W and a gas pressure of 100-150 mt in a reaction chamber to form plasmas, and etching a silicon nitride material by the plasmas formed from the third reaction gas to form the pattern of the gate insulation layer.

Since the etching effect of the plasmas of the second reaction gas generated in step 302 on the silicon nitride material of the gate insulation layer is relatively low, execution for step 304 is not influenced by step 302.

According to the dry etching method provided by the third embodiment of the present invention, after the silicon nitride material is etched to form the pattern of the passivation layer, the plasmas are formed by introducing the second reaction gas composed of oxygen and sulphur hexafluoride in the reaction chamber, and exciting the second reaction gas with the radiofrequency power of 500-2000 W, so that the plasmas formed from the second reaction gas are combined with the particulate pollutants in the reaction chamber to form the dust plasmas, and in this case the reaction chamber is vacuumized to execute conversion processing, therefore, the technical solution of the present invention is capable of effectively preventing particulate pollutants from falling onto the glass substrate in the procedure of executing conversion processing, meanwhile, the effect of chamber purifying through vacuumizing is improved, and the amount of the particulate pollutants in the reaction chamber is effectively reduced.

Fourth Embodiment

In the fourth embodiment of the present invention, the dry etching method provided by the present invention is described by taking a process of etching a photoresist layer and an amorphous silicon layer for example, in which the photoresist layer is located above the amorphous silicon layer. A reaction gas selected in the process of etching the photoresist layer is a mixed gas composed of oxygen and sulphur hexafluoride, whereas a reaction gas selected in the process of etching the amorphous silicon layer is a mixed gas composed of chlorine and sulphur hexafluoride.

Figure 4:
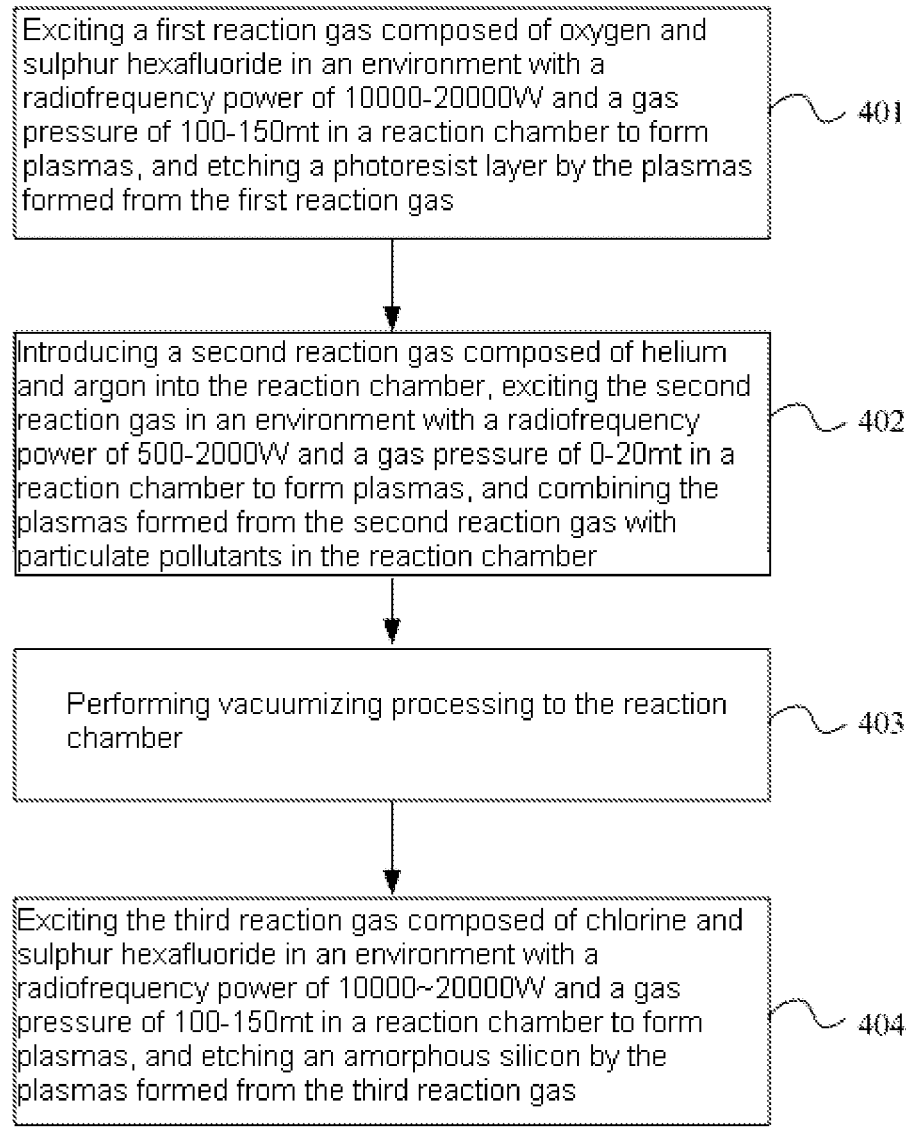
FIG. 4 is a flow diagram of the dry etching method provided by a fourth embodiment of the present invention.

FIG. 4 is a flow diagram of the dry etching method provided by the fourth embodiment of the present invention. As shown in FIG. 4, the dry etching method comprising the following steps 401, 402, 403 and 404.

Step 401: exciting a first reaction gas composed of oxygen and sulphur hexafluoride in an environment with a radiofrequency power of 10000-20000 W and a gas pressure of 100-150 mt in a reaction chamber to form plasmas, and etching a photoresist layer by the plasmas formed from the first reaction gas.

Step 402: introducing a second reaction gas composed of helium and argon into the reaction chamber, exciting the second reaction gas in an environment with a radiofrequency power of 500-2000 W and a gas pressure of 0-20 mt to form plasmas, and combining the plasmas formed from the second reaction gas with particulate pollutants in the reaction chamber.

It should be noted that, in the embodiment, since the first reaction gas for etching the photoresist layer is different from a third reaction gas for etching an amorphous silicon layer, in order to prevent the second reaction gas from reacting with the first reaction gas or the third reaction gas, a mixed gas composed of inert gases is used as the second reaction gas.

Meanwhile, the radiofrequency power in step 402 is also less than the radiofrequency powers in step 401 and the subsequent step 404.

Step 403: performing vacuumizing processing to the reaction chamber.

In the embodiment, step 402 may be executed at first, and then step 403 is executed a while after step 402. Alternatively, step 402 and step 403 may be executed simultaneously.

Step 404: exciting the third reaction gas composed of chlorine and sulphur hexafluoride in an environment with a radiofrequency power of 10000-20000 W and a gas pressure of 100-150 mt in the reaction chamber to form plasmas, and etching the amorphous silicon layer by the plasmas formed from the third reaction gas.

Since the etching effect of the plasmas generated in step 402 on the amorphous silicon material is low, execution for step 404 is not influenced by step 402.

According to the dry etching method provided by the fourth embodiment of the present invention, after the photoresist layer is etched, the plasmas are formed by introducing the second reaction gas composed of helium and argon into the reaction chamber, and exciting the second reaction gas with the second radiofrequency power of 500-2000 W, so that the plasmas formed from the second reaction gas are combined with particulate pollutants in the reaction chamber to form the dust plasmas, and in this case the reaction chamber is vacuumized to execute conversion processing, therefore, the technical solution of the present invention is capable of effectively preventing particulate pollutants from falling onto the glass substrate in the procedure of executing conversion processing, meanwhile, the effect of chamber purifying through vacuumizing is improved, and the amount of the particulate pollutants in the reaction chamber is effectively reduced.

It should be appreciated that, the foregoing implementations are merely specific implementations adopted for illustrating the principle of the present invention, but the protection scope of the present invention is not limited thereto. Various variations and improvements could be made by those of ordinary skill in the art without departing from the spirit and essence of the present invention, but the variations and improvements are still considered to be within the patent protection scope of the present invention.

The invention claimed is:

1. A dry etching method, comprising steps of:
   etching a first medium layer on a substrate in a reaction chamber by a first gas as a reaction gas with a first radiofrequency power level provided by a radiofrequency module;
   introducing a second gas into the reaction chamber while the radiofrequency module keeps working and exciting the second gas into a plasma with a second radiofrequency power level while the radiofrequency module keeps working, so that the plasma formed from the second gas is combined with particulate pollutants in the reaction chamber to form a dust plasma, and the particulate pollutants keep in a suspended state instead of falling onto the substrate after the first medium layer is etched;
   pumping down the reaction chamber to a vacuum; and
   etching a second medium layer on the substrate in the reaction chamber by a third gas as a reaction gas.

2. The dry etching method according to claim 1, wherein the step of etching the first medium layer comprises:
   introducing the first reaction gas into the reaction chamber, and exciting the first gas into plasma with the first radiofrequency power level, so that the plasma formed from the first gas are used for etching the first medium layer,
   wherein the second radiofrequency power level is less than the first radiofrequency power level.

3. The dry etching method according to claim 1, wherein the step of etching the second medium layer comprises:
   introducing a third gas in the reaction chamber, and exciting the third gas into plasma with a third radiofrequency power level, so that the plasma formed from the third gas are used for etching the second medium layer,
   wherein the third radiofrequency power level is greater than the second radiofrequency power level.

4. The dry etching method according to claim 3, wherein the second gas is the same as the third gas.

5. The dry etching method according to claim 1, wherein the second radiofrequency power level ranges from 500 to 2000 W.

6. The dry etching method according to claim 1, wherein the second gas is an inert gas.

7. The dry etching method according to claim 6, wherein the inert gas is argon or helium.

8. The dry etching method according to claim 1, wherein in the process of exciting the second gas into plasma with the second radiofrequency power level, a gas pressure in the reaction chamber is less than 20 mt.

* * * * *